United States Patent
Skepnek et al.

(10) Patent No.: US 8,885,342 B2
(45) Date of Patent: Nov. 11, 2014

(54) THERMAL MANAGEMENT FOR ELECTRONIC DEVICE HOUSING

(75) Inventors: Robert Skepnek, Chicago, IL (US); Alexandros Pirillis, Skokie, IL (US); Andrius Zernaitis, Naperville, IL (US)

(73) Assignee: Methode Electronics, Inc., Chicago, IL (US)

( * ) Notice: Subject to any disclaimer, the term of this patent is extended or adjusted under 35 U.S.C. 154(b) by 926 days.

(21) Appl. No.: 12/981,297

(22) Filed: Dec. 29, 2010

(65) Prior Publication Data

US 2012/0168122 A1    Jul. 5, 2012

(51) Int. Cl.
*H05K 7/20* (2006.01)
*H01L 23/40* (2006.01)
*H01L 23/367* (2006.01)
*H01L 23/433* (2006.01)

(52) U.S. Cl.
CPC .......... *H01L 23/4093* (2013.01); *H01L 23/367* (2013.01); *H01L 23/433* (2013.01)
USPC ........ 361/709; 361/379.54; 174/548; 385/92; 439/487

(58) Field of Classification Search
USPC ....................... 361/676–678, 679.46–679.54, 361/688–722, 752, 760, 831
See application file for complete search history.

(56) References Cited

U.S. PATENT DOCUMENTS

| | | | |
|---|---|---|---|
| 6,508,595 B1 | 1/2003 | Chan et al. | |
| 6,793,517 B2 * | 9/2004 | Neer et al. | 439/372 |
| 6,816,376 B2 | 11/2004 | Bright et al. | |
| 6,980,437 B2 | 12/2005 | Bright | |
| 6,986,679 B1 * | 1/2006 | Aronson et al. | 439/374 |
| 7,355,857 B2 | 4/2008 | Pirillis et al. | |
| 7,371,965 B2 | 5/2008 | Ice | |
| 7,539,018 B2 * | 5/2009 | Murr et al. | 361/704 |
| 7,764,504 B2 * | 7/2010 | Phillips et al. | 361/715 |
| 2003/0141090 A1 | 7/2003 | Kruger et al. | |
| 2003/0169983 A1 * | 9/2003 | Branch et al. | 385/92 |
| 2005/0195565 A1 * | 9/2005 | Bright | 361/688 |
| 2005/0195571 A1 * | 9/2005 | Bulman-Fleming et al. | 361/704 |
| 2011/0110044 A1 * | 5/2011 | Wei et al. | 361/704 |

* cited by examiner

*Primary Examiner* — Courtney Smith
(74) *Attorney, Agent, or Firm* — Loeb & Loeb LLP

(57) ABSTRACT

The present invention relates to a cage for thermal management and for housing an electronic module. The cage includes top, bottom and side walls joined to form an interior cavity. The side walls form an enclosure having a first panel. A thermally conductive pathway is disposed on the first panel. The enclosure receives an electronic device such as a transceiver module and a heat sink mounted on the first panel. The thermally conductive pathway is disposed between the electronic device and the heat sink so that heat from the electronic device is transmitted via the thermally conductive pathway to the heat sink.

20 Claims, 6 Drawing Sheets

THERMAL MANAGEMENT FOR ELECTRONIC DEVICE HOUSING

The present invention pertains to an improved thermal management system for an electronic device housing including a cage having thermally conductive pathways.

BACKGROUND

Thermal management of electronic devices has given rise to many components to deal with heat. For example heat sinks are well known for drawing heat away from electronic components such as a micro-processor. Heat sinks are used to make physical contact with a heat developing device. The heat sinks generally have posts or fins that are elevated to make contact with the air flow above the heat generating device. Air flow removes heat from the posts or tins. However, heat sinks do not make 100% contact with the entire surface of the heat developing device, due to imperfections in the flatness of the bottom of the heat sink, imperfections in the flatness of the heat developing device and non-conduction or poor rate of heat transfer due to interfering objects such as recesses or labels. In addition heat sinks only affect the top surface of the heat developing device upon which the heat sink is mounted. Some solutions have been provided where a spring member is disposed on a cage between a heat sink and an electronic module in order to bias the module towards the heat sink. While such a spring member may allow a bit more heat to be transferred to the heat sink due to the closer proximity of the heat sink to the module, this solution fails to alleviate insufficient heat transfer due to imperfections in flatness of the heat sink and heat developing device. In addition, when there are multiple heat developing devices, there have been multiple heat sinks attached to such devices which cause for great assembly time and expense. Therefore, in order to overcome the disadvantages above, applicant has developed the present invention.

SUMMARY

The present invention pertains to a cage for thermal management and for housing an electronic module comprising a cage housing having a top, bottom and side walls joined to form an interior cavity and the side walls defining a width of the interior cavity. The top wall has a plurality of conductive members. The conductive members are arranged side by side along a length of the top wall. The length is at least 80% of the width, so that heat generated by the electronic module mounted within the cavity is dissipated via the conductive members to a heat sink mounted on the top wall. In an embodiment, the length may be at least 98% of the width. In an embodiment, each conductive member is stamped from the top wall to form an arcuate shaped finger. In an embodiment, two sets of two rows of conductive members may be formed from the top wall of the cavity, each conductive member formed as a cantilever. In an embodiment, a first row of conductive members may be stamped, so that each conductive member has a terminal portion extending in a first direction; and a second row of conductive members is stamped, so that each conductive member has a terminal portion extending in a second direction, opposite the first direction. In an embodiment, each of the conductive members may include an apex portion adjacent each terminal portion and the apex portion formed to engage a top surface of an electronic module received in a cavity and the conductive member for transmitting heat from the electronic module to the electronic module to the heat sink via at least the apex and terminal portions.

In an embodiment, the cage may include multiple cavities for receiving multiple electronic modules. The top wall may enclose multiple cavities and a heat sink may be mounted in a stationary manner to the top wall, straddling at least three cavities and engaging conductive members provided on the top wall of each of the three cavities. In an embodiment, the conductive members may be formed to engage a bottom surface of the heat sink mounted on the top wall of the cage. In an embodiment, at least three conductive members may be arranged linearly in a row across the top wall, at least one conductive member of each row adjacent a first sidewall and a second sidewall, the first and second side walls forming the interior cavity. In an embodiment, the conductive members may be arranged linearly in two rows across the top wall.

The present invention may also provide for a housing for an electronic device comprising in an enclosure having a first panel, a thermally conductive pathway disposed on the first panel, the enclosure for receiving the electronic device and a heat sink mounted on the first panel and the thermally conductive pathway disposed between the electronic device and the heat sink in so that heat from the electronic device is transmitted via the thermally conductive pathway to the heat sink. In an embodiment, the thermally conductive pathway may include a metallic finger having a terminal portion and an apex portion and the finger is disposed on the first panel, so that the terminal portion abuts the electronic device and the apex portion abuts the heat sink. In an embodiment, the finger is arcuate shaped and is stamped from a metal planar first panel.

BRIEF DESCRIPTION OF THE DRAWINGS

The invention is described through a preferred embodiment in the attached drawings in which.

DETAILED DESCRIPTION

Figure 1:
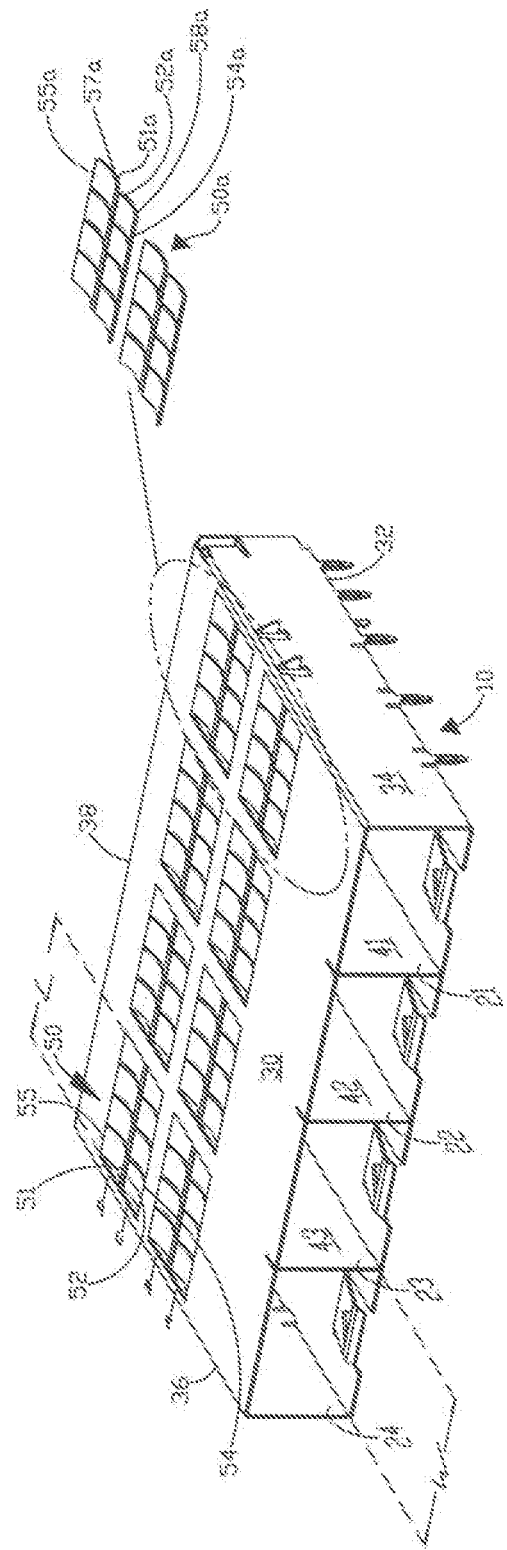
FIG. 1 depicts a perspective view of the present invention in an embodiment having a ganged group of cages.

The present invention provides for thermal management of electronic device housing and particular embodiments of such invention are described with respect to the drawing figures as follows:

With reference to FIGS. 1-4, an embodiment a cage 10 of the present invention is provided having a ganged construction for receiving an electronic module 20 (FIG. 5) received in a first interior cavity 21. The ganged cage 10 also includes second interior cavity 22, third interior cavity 23 and fourth interior cavity 24. Each of the cavities 21, 22, 23, 24 may receive electronic modules mounted in a ganged orientation. It is to be understood that the present invention may be implemented for cages and housings that are not ganged and/or are not integrated side-by-side. The present invention may be implemented for a cage having a single cavity, or any number of cavities.

In a preferred embodiment, the cage housing 10 is stamped of metal and includes a top wall 30, a bottom wall 32, side walls 34, 36, back wall 38 and divider walls 41, 42 and 43. The top wall provides a first panel 30 formed of a single metal sheet covering each of the four cavities 21, 22, 23, 24. The metal planar first panel 30 has stamped conductive members (e.g. fingers) 50 and mounted over the panel 30 is a heat sink 60. In the embodiment depicted in FIG. 1, a plurality of conductive members 50 are aligned in rows A, B, C, D.

The walls 36 and 43 define a width W of the cavity (FIG. 1). In an embodiment, W may be 0.561 inches. It can be seen that the rows A, B, C, D are arranged so that the conductive members 50 extend across each cavity in a preferred embodiment. It can be seen that conductive members 50 are extended across the top wall 30 to maximize the number of conductive members 50 in order to nearly cover the width W, so that a substantial portion of the top wall 30 is populated with conductive members 50 in order to cool the module 20 to the greatest degree and transmit heat to the greatest degree possible to heat sink. In an embodiment, the conductive members 50 are populated along a length L of the top wall. In an embodiment, L may be at least 75% of the width W. In the embodiment depicted in FIG. 1, the conductive members 50 are arranged along a length L of the top wall 30 and the length L is 0.46 inches and at least 80% of the width W. In an alternate embodiment, the length L is at least 98% of the width W.

Figure 2:
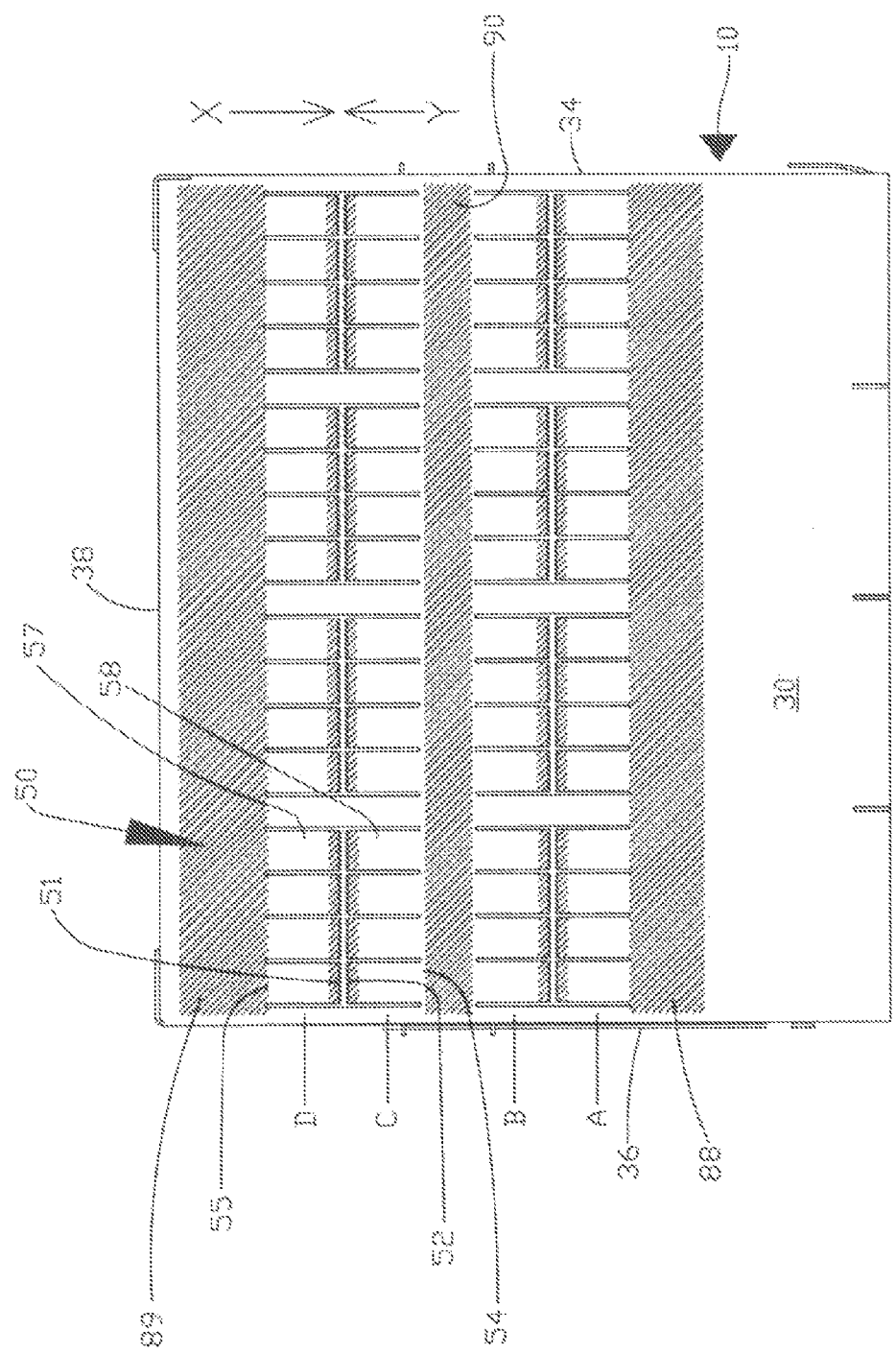
FIG. 2 depicts a plan view of the ganged cage of FIG. 1.

FIG. 1 depicts the conductive members 50 arranged in rows A, B, C and D along the top wall 30. For illustration purposes, the conductive members 50a are depicted in FIG. 1 in an exploded view separated from the top wall 30, so that they may be more clearly viewed and described with respect to the present invention. In an embodiment, each conductive member 50, 50a is formed as an arcuate shaped finger formed as a cantilever stamped from the metal top wall 30. Each conductive member 50, 50a includes a terminal portion 51, 51a, 52, 52a. So for example, the conductive members in row D include terminal portion 51 and the conductive members in row C include a terminal portion 52, as depicted in FIGS. 1 and 2. With respect to the schematic view of conductive members 50a of FIG. 1 include terminal portions 51a, 52a. Each conductive member is integrally formed from the top wall 30 and is attached to the top wall at an attachment point 54, 54a, 55, 55a. For example, the conductive members in row D are attached to the top wall 30 at attachment point 55, 55a and the conductive members in row C are attached to the top wall 30 at attachment point 54, 54a. Thus, as shown in FIG. 2, the conductive members 50 in row D extend in a first direction X and the conductive members in row C extend in a second direction Y, opposite the first direction X. Likewise, the conductive members 50 in row B extend in the first direction X and the conductive members in row A extend in the second direction Y.

Each conductive member 50 includes an apex portion 57, 57a, 58, 58a. The functioning of the apex portion 57, 58 and terminal portions 51 and 52 will be described in more detail below. It is to be understood that while the preferred embodiment depicts conductive members 50 in four rows A, B, C and D, (i.e. two sets of conductive members in two rows) the present invention could be implemented with only one row or no rows at all. For example, the conductive members 50 may be oriented in non-uniform or staggered orientations across the top wall 30. Other types of conductive members 50 and orientations of conductive members 50 may be provided and formed as a strut, upright, nail, wall, hook, beam, wing, etc. and may be placed in any orientation on the top wall 30 in order to provide a thermally conductive pathway. In an embodiment, a single conductive member may be provided adjacent side wall 36 and an adjacent second single conductive member is provided adjacent side wall 43. It may be desirable to provide thermal grease on the top wall 30 and between the top wall 30 and a heat sink 60 mounted thereon in order to enhance the thermal conductivity between the top wall 30 and the heat sink 60. So cup-shaped conductive members 50 may be provided in order to retain the thermal grease.

Figure 3:
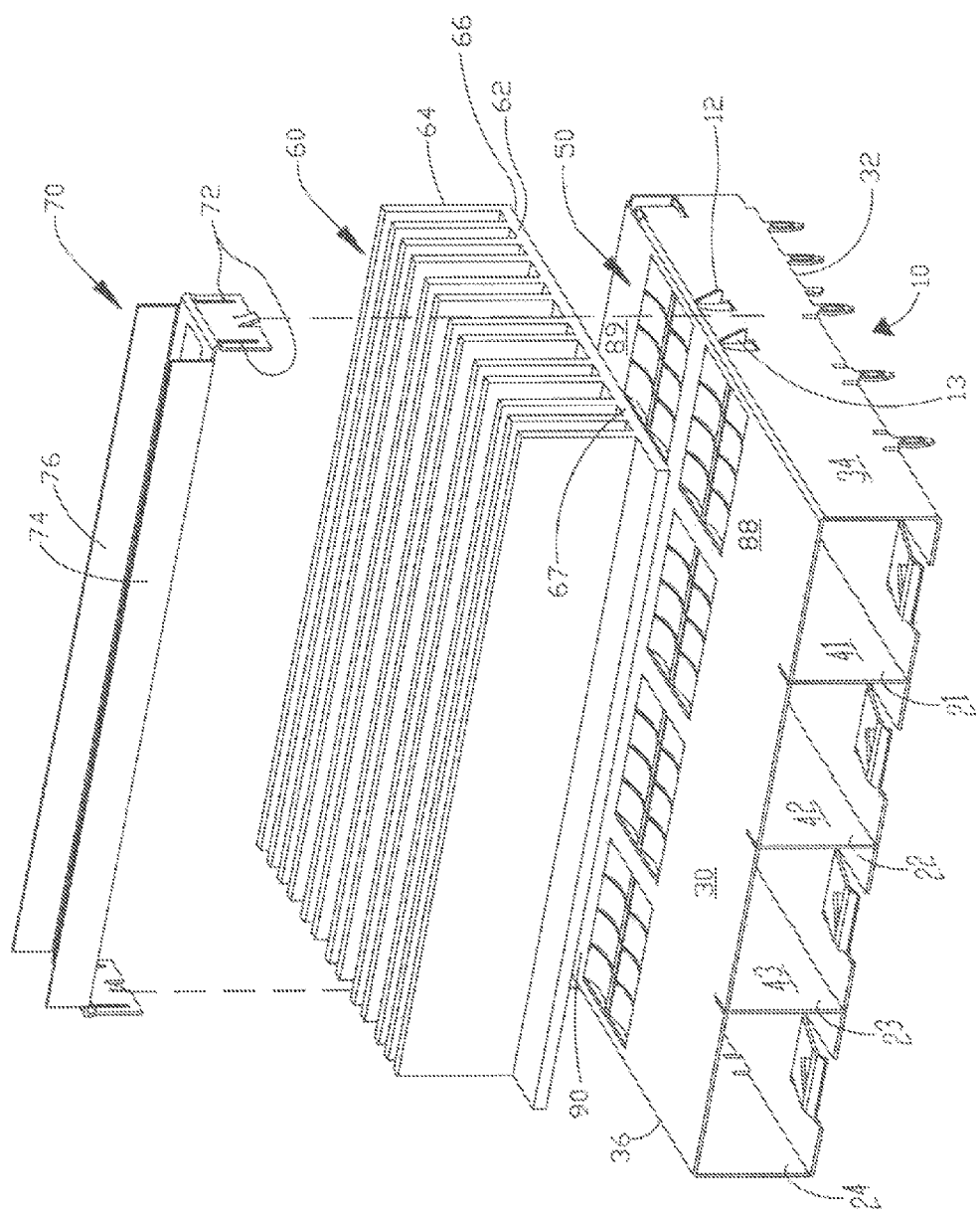
FIG. 3 depicts a perspective, exploded view of the invention of FIG. 1, having a heat sink and clip being assembled.

Turning to FIG. 3, a heat sink 60 is depicted being mounted to the cage 10 along its base 62. Extending from the base 62 are uprights, posts or tins 64 for cooling of the heat sink 60 and allowing for air distribution around the tins 64. A clip 70 is provided for securing the heat sink 60 to the top wall 30 of the cage 10. In an embodiment, the clip 70 includes a slots 72 for engaging detentes 12, 13 of the sidewall 34, 36 of the cage 10. When the clip 70 is pushed downward over the heat sink 60, the pair of slots 72 at each end engage the detentes 12, 13 and a snap-fit connection is made in order to retain the clip 70 over the heat sink 60 and to retain the heat sink 60 on the cage 10. In a preferred embodiment, the clip 70 provides a stationary mounting for the heat sink 60 to the cage 10. The clip 70 includes a pair of rigid beams 74, 76, so that the clip 70 will not deflect when a electronic module 20 is inserted in a cavity 21 and so that the heat sink 60, likewise will not deflect upward.

Figure 4:
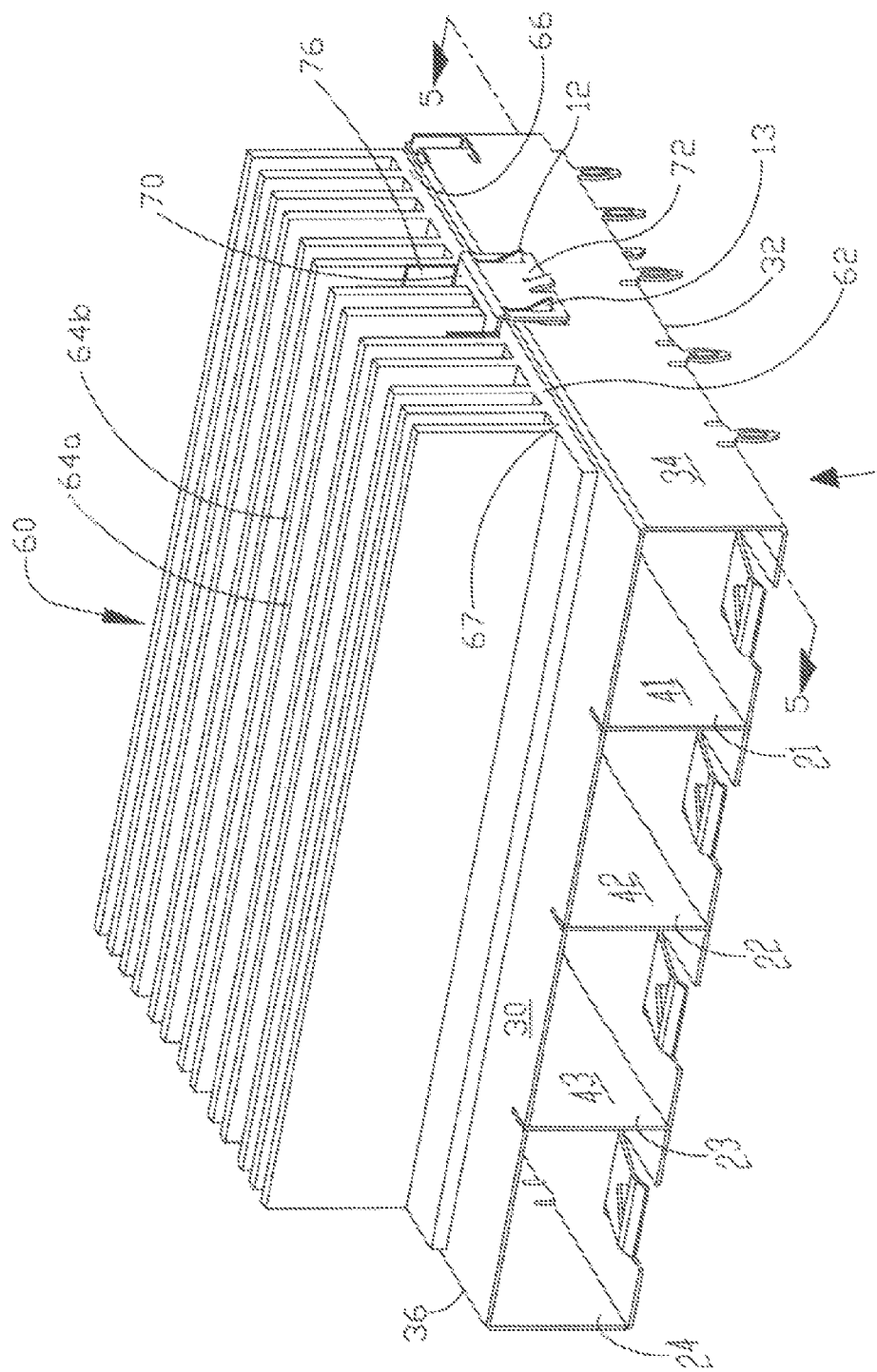
FIG. 4 depicts a perspective view of the invention depicted in FIG. 3, fully assembled.

In the embodiment depicted in FIGS. 3 and 4, where the ganged cage 10 is depicted, a stationary heat sink 60 can be provided irregardless of the number of cavities 21, 22, 23, 24 that are populated with electronic devices 20. In this way, only a single heat sink 60 is required regardless of the number of the cavities. An alternate embodiment could include anywhere between one to fifty cavities, and a single heat sink may be used for such sized cages, in order to eliminate extra parts and assembly.

The top wall 30 includes mounting areas 88, 89 (FIGS. 2 and 3) adjacent the edges of row A and row D of the conductive members 50. A central mounting area 90 is provided between the rows of conductive members 50. In an embodiment, the heat sink 60 has a base 62 which is broad enough to cover the mounting areas 88, 89, 90 (shaded areas of FIG. 2) so that substantial metal to metal contact is made between the top wall 30 of the cage 10 and the base 62 of the heat sink 60. The heat sink base 62 includes overhang portions 66, 67 to engage the mounting areas 88, 89, respectively.

As shown in FIG. 4, when the clip 70 is attached to the cage 10, the heat sink 60 is secured in stationary manner so that the mounting areas 88, 89, 90 are completely covered by the heat sink base 62. In particular, overhang 66 covers mounting area 89, and overhang 67 covers mounting area 88 when the heat sink 60 is mounted to the cage 10. As shown in FIG. 4, it can be seen that the clip 70 is secured over the fins 64a, 64b and engages the heat sink 60, so that it is securely fastened to the top wall 30 of the cage 10. It is also understood that the heat sink 60 covers the rows of conductive members A, B, C, D, so that the conductive members 50 will make contact with the bottom of the base 62 of the heat sink 60. The shaded areas in FIG. 2 depict the contact areas of the top wall 30 which act as thermally conductive pathways, including the mounting areas 88, 89, 90. Also the terminal portions 51, 52 of each of the conductive members 50 in each of the rows A, 3B. C. D are depicted in FIG. 2 as thermally conductive pathways to the heat sink 60. In a preferred embodiment, the contact areas of the top wall 30 provide for a thermally conductive pathway surface area of approximately 30% to 70% of the surface area of the base 62 of the heat sink 60.

While the contact areas 88, 89, 90 of the cage 10 provide a thermally conductive pathway to the heat sink: thermally conductive pathways are provided from the electronic module via the apex portions 57, 58 of the conductive members 50 (as discussed in detail below). Thus, in an embodiment each conductive member 50 in combination with the contact areas 88, 89, 90 of the cage 10 may provide thermally conductive pathways.

Figure 5:
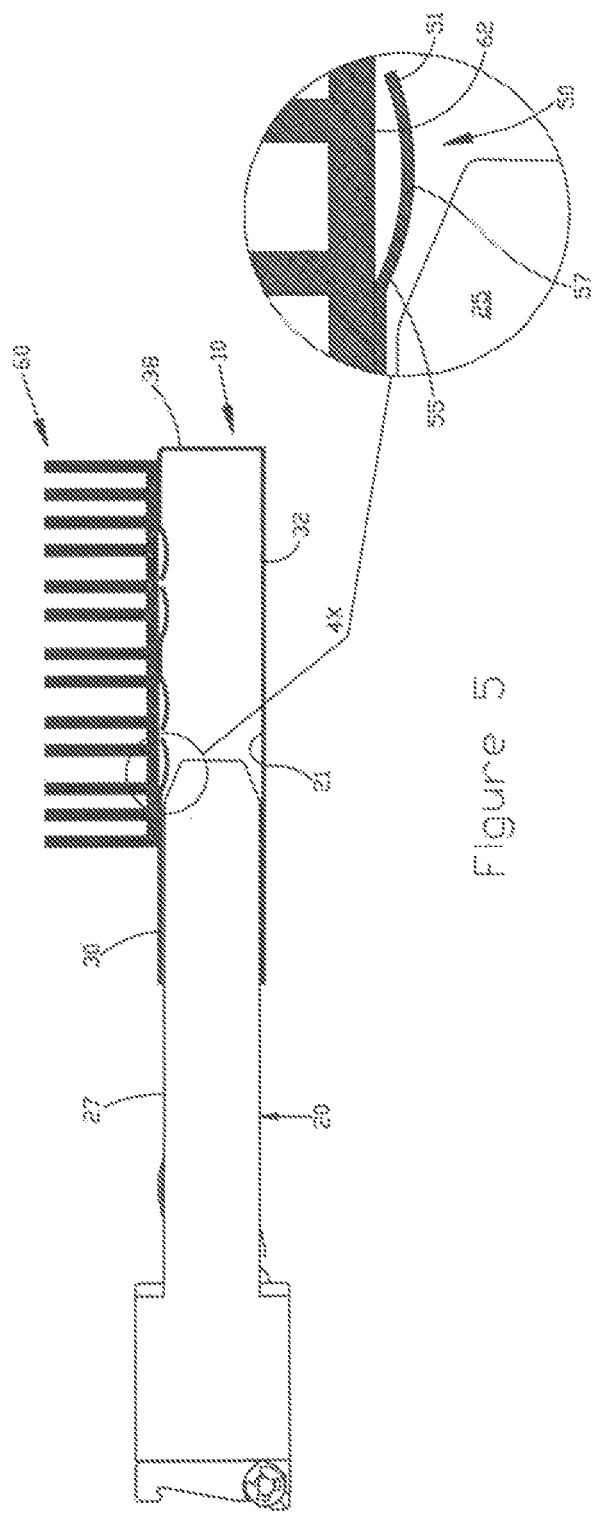
FIG. 5 depicts a schematic, side-elevation, cut-away view of the invention of FIG. 4 taken at line 5-5 and having an electronic module in the process of being inserted within a cavity of a cage.
Figure 6:
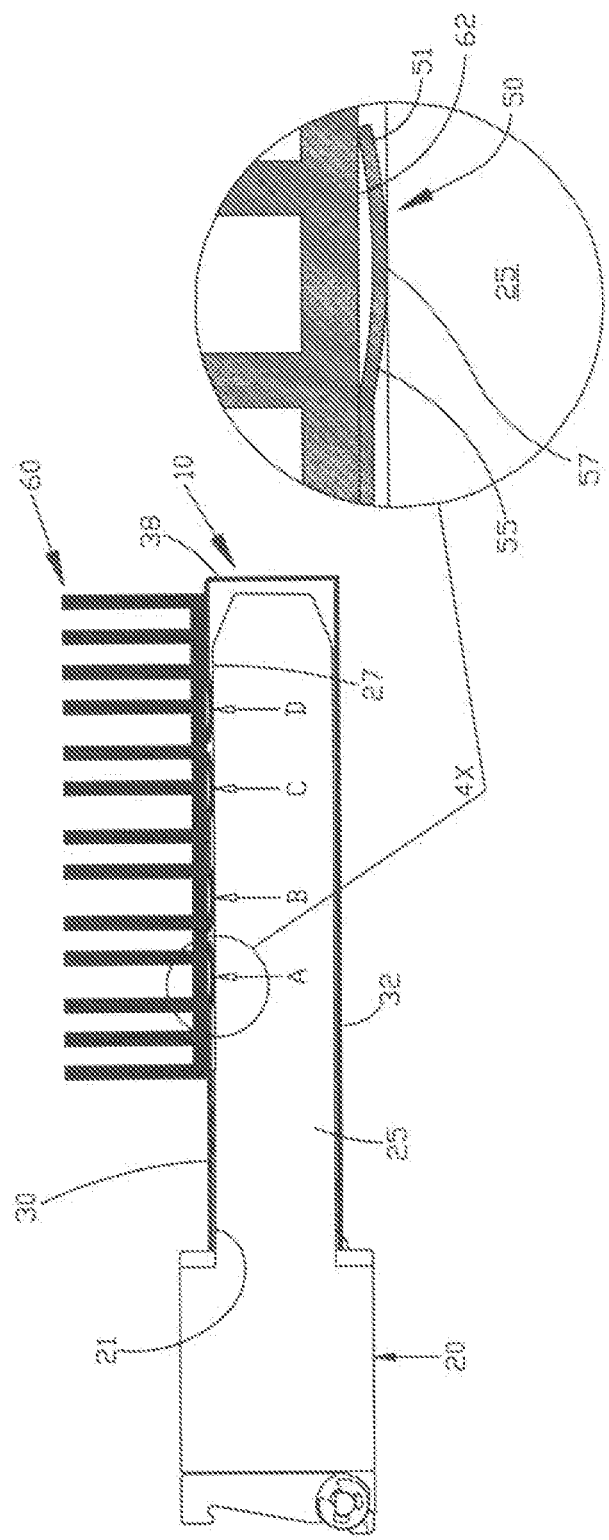
FIG. 6 is a schematic, side-elevation, cut-away view of FIG. 5 depicting the electronic module fully inserted within the cavity of the cage.

Turning to FIGS. 5 and 6, a description of the functioning of the cage and conductive members when an electronic module is inserted will be discussed. FIG. 5 shows the electronic module 20 beginning to be inserted within the cavity 21 of the cage 10. The cage 10 includes a top wall 30, which includes conductive members 50 disposed therein. As described above with respect to a preferred embodiment, four rows of conductive members 50 are provided in the top wall 30. Each conductive member 50 is formed in the shape of an arcuate finger having an attachment point 55 where the finger attaches to the upper wall 30. The conductive member 50 is concave and curves downward to provide an apex point 57 and a terminal portion 51 at its end. The cantilever form of the conductive member 50 allows for it to flex when the module 20 is inserted in the cavity 21.

As shown in FIG. 6, the insertion of a body 25 of the electronic module 20 causes the arcuate shaped conductive members 50 to compress due to the force of the top surface 21 of the body 25 of the module 20 engaging the apex 57, for each of the conductive members 50. As the body 25 is inserted within the cavity 21, each successive row A, B, C, D, of conductive members 50 is engaged by the top surface 27, causing each row of successive fingers 50 to be compressed. As a result of the compression force, the terminal portion 51 of each conductive member 50 engages the base 62 of the heat sink 60. Due to the cantilever form of each conductive finger 50, the terminal portion 51 of each finger will engage the bottom of the heat sink 60 and provide a thermally conductive pathway that extends from the top surface 27 of the electronic module through the conductive members 50 and to the base 62 of the heat sink 60.

As depicted in FIGS. 1-3, each cavity 20 includes conductive members 50 in four rows A, B, C, D, each row having four conductive members 50. Since each conductive member 50 includes a terminal portion 51, it may be understood that in such an embodiment upon insertion of the electronic module 20 within the cavity 21, sixteen individual terminal portions 51 make contact with the bottom of the heat sink 60 and sixteen individual apex points 57 make contact with the top surface 27 of the electronic module 20 for each cavity 21. Due to the flexibility of each of the conductive members 50, variations in the flatness of the bottom 62 of the heat sink 60 can be accommodated due to the numerous conductive members 50. As well, any variations of the flatness of the top surface 27 of the body 25 of the electronic module 20 can be accommodated by the multiplicity conductive members 50 provided in the top wall 30 of each cavity 21. Thus, even when the top surface 27 of the electronic module 20 and the bottom 62 of the heat sink 60 are not flat and completely planar, the multiple conductive members 50 providing individual spring loads between the electronic component 20 and the heat sink 60, provide sufficient spring force in order to maintain multiple, robust, thermally conductive pathways therebetween. So for example, even if the top surface 27 of the electronic module includes a recess for a label, the conductive members 50 will still make contact with the top surface 27 within the recess portion of the body 25 of the electronic module 20. In the preferred embodiment, each arcuate shaped conductive member 50 has concavity sufficient to allow for a range of deflection of the finger between 0.010 inches and 0.040 inches, so that variations in the upper surface 27 of the electronic module and the base 62 of the heat sink 60 may be accommodated. Since the heat sink 60 is securely fastened in place with the clip 70 and does not allow for the heat sink 60 to travel upwards when the transceiver 20 is inserted into the cage 10 the main deflection of the conductive members 50 is due to the variation in the flatness of the top surface 27 of the electronic module.

It is also to be understood that the entire top surface 30 of the cage 10 may act as a thermally conductive pathway; as the heat from the electronic module 20 may be transmitted via the conductive member 50 via the attachment point 55 onto the top wall 30 (including mounting areas 88, 89, 90 as depicted in FIG. 2). In this way, the conductive members 50 and top wall 30 of the cage 10 may evenly and equally transmit heat energy from the electronic module 20 to the heat sink 60. It is to be understood that modifications of the preferred embodiment disclosed herein may be provided that also allow for even and equal transmission of heat energy from the electronic module 20 to the heat sink 60. For example, alternate arrangements and sizes of conductive members 50 and thermally conductive pathways may be provided by the cage 10 that allow for different size transceiver modules 20 to be inserted within the cavity 21 and also to accommodate for different material properties of the module, cage and heat sink. In an embodiment, thermal grease may be adhered to the top surface 30 on the mounting areas 88, 89, 90 in order to enhance the thermal conductivity between the top surface 30 of the cage 10 and the heat sink 60.

Those of skill in the appropriate art will understand that a number of alternative embodiments of the present invention exists. The above description only provides particular embodiments and one in the skill of the art will understand that additional means of implementing the present invention understands that there are additional means of implementing the present invention.

What is claimed:

1. A cage for thermal management and for receiving a plurality of electronic modules within a plurality of cavities, the cage comprising:
    a cage housing having top, bottom and side walls joined to form a ganged cage, having at least two interior cavities and the side walls defining a width of the interior of each cavity; and
    the top wall having a plurality of conductive members, the conductive members arranged side by side along the top wall so that heat generated by the electronic module mounted within the cavity is dissipated via the conductive members to a heat sink mounted on the top wall; the heat sink mounted on the top wall straddling at least two cavities and engaging conductive members provided on the top wall of each of the at least two cavities.

2. The cage of claim 1 wherein the length is at least 98% of the width.

3. The cage of claim 1 wherein each conductive member is stamped from the top wall to form an arcuate shaped finger.

4. The cage of claim 1 wherein two sets of two rows of conductive members are formed from the top wail of the cavity, each conductive member formed as a cantilever.

5. The cage of claim 4 wherein a first row of conductive members is stamped so that each conductive member has a terminal portion extending in a first direction and a second row of conductive members is stamped so that each conductive member has a terminal portion extending in a second direction, opposite the first direction.

6. The cage of claim 5 wherein each of the conductive members includes an apex portion adjacent each terminal portion and the apex portion formed to engage a top surface of an electronic module received in a cavity and the conductive member for transmitting heat from the electronic module to the heat sink via at least the apex and terminal portions.

7. The cage of claim 1 wherein the cage includes multiple cavities for receiving multiple electronic modules: the top wail enclosing the multiple cavities; and a heat sink mounted in a stationary manner to the top wall, straddling at least three cavities and engaging conductive members provided on the top wall of each of the three cavities.

8. The cage of claim 7 wherein the conductive members are formed to engage a bottom surface of the heat sink mounted on the top wall of the cage.

9. The cage of claim 7 wherein at least three conductive members are arranged linearly in a row across the top wall, at least one conductive member of each row adjacent a first side wall and a second side wall, the first and second side walls forming the interior cavity.

10. The cage of claim 9 wherein conductive members are arranged linearly in two sets of two rows across the top wall.

11. A housing for an electronic device, the housing having at least two cavities, the housing comprising: an enclosure having a first panel; a thermally conductive pathway disposed on the first panel; the enclosure for receiving the electronic device and a heat sink mounted on the first panel; and the thermally conductive pathway disposed between the electronic device and a heat sink so that heat from the electronic device is transmitted via the thermally conductive pathway to the heat sink; and the heat sink mounted to the top wall, straddling the at least two cavities and engaging conductive members provided on the top wall of each of the at least two cavities.

12. The housing of claim 11 wherein the thermally conductive pathway includes a metallic finger having a terminal portion and an apex portion and the finger is disposed on the first panel so that the terminal portion abuts the electronic device and the apex portion abuts the heat sink.

13. The housing of claim 12 wherein the finger is arcuate shaped and is stamped from a metal planer first panel.

14. The housing of claim 11 wherein a plurality of thermally conductive pathways are arranged it at least two rows for engaging the electronic device.

15. The housing of claim 11 wherein the housing includes at least three cavities for receiving at least three electronic devices therein and each cavity has a corresponding first panel having disposed therein at least two rows of thermally conductive pathways.

16. A metallic cage for receiving a plurality of electronic modules in a plurality of cavities comprising: a metallic enclosure having top, bottom and side walls joined to form a ganged cage having at least three cavities for receiving at least three electronic modules; a plurality of conductive members integrally formed in the top wall by stamping protruding conductive members for each of the three cavities; and a heat sink mounted in a stationary manner on the top wall and extending along the top wall straddling at least a majority of the three cavities and in abutting engagement with the conductive members, so that heat from at least three electronic modules received in the cavities may be transferred via the conductive members to the heat sink.

17. The cage of claim 16 wherein a row of conductive members are provided by the top wall, the row of conductive members extends across the cavity width.

18. The cage of claim 17 wherein at least two rows of conductive members are provided for each cavity.

19. The cage of claim 16 wherein each conductive member comprises a metallic finger and includes a terminal portion for engaging an outer surface of heat sink and an apex potion for engaging an outer surface of the electronic module in order to transfer heat from the electronic module to the heat sink via the finger member.

20. The cage of claim 19 wherein each conductive member is stamped from the top wall and integrally formed therewith in a cantilever orientation so that upon insertion of the electronic module within the cavity, a top surface of the electronic module abuts the conductive member so that it deflects away from the module in order to engage the heat sink mounted on the top wall.

* * * * *